United States Patent [19]
Hsieh

[11] Patent Number: 5,781,568
[45] Date of Patent: Jul. 14, 1998

[54] ERROR DETECTION AND CORRECTION METHOD AND APPARATUS FOR COMPUTER MEMORY

[75] Inventor: Michael Ming-Cheng Hsieh, San Jose, Calif.

[73] Assignee: Sun Microsystems, Inc., Palo Alto, Calif.

[21] Appl. No.: 921,766

[22] Filed: Aug. 15, 1997

Related U.S. Application Data

[63] Continuation of Ser. No. 608,530, Feb. 28, 1996, abandoned.

[51] Int. Cl.$^6$ .................... G11C 29/00; H03M 13/00
[52] U.S. Cl. ................ 371/40.12; 371/40.4; 371/40.17; 371/51.1
[58] Field of Search ................. 371/37.6, 40.11, 371/40.12, 40.17, 40.4, 51.1, 40.18

[56] References Cited

U.S. PATENT DOCUMENTS

| | | | |
|---|---|---|---|
| H1176 | 4/1993 | Schwoerer | 371/2.2 |
| 3,697,949 | 10/1972 | Carter et al. | 371/40.1 |
| 4,464,753 | 8/1984 | Chen | 371/40.1 |
| 4,692,922 | 9/1987 | Kiriu et al. | 371/37.1 |
| 4,713,816 | 12/1987 | Van Gils | 371/40.1 |
| 4,888,774 | 12/1989 | Kosuge et al. | 371/38.1 |
| 5,450,423 | 9/1995 | Iwasaki et al. | 371/40.1 |
| 5,535,227 | 7/1996 | Silvano | 371/40.4 |
| 5,550,849 | 8/1996 | Harrington | 371/37.1 |
| 5,563,894 | 10/1996 | Fujiwara et al. | 371/37.1 |
| 5,600,659 | 2/1997 | Chen | 371/37.1 |

OTHER PUBLICATIONS

Reddy, S., "A Class of Linear Codes for Error Control in Byte-per-Card Organized Digital Systems", IEEE Transactions on Computers, vol. C–27, No. 5, May 1978, pp. 455–459.

Kaneda, S., "A Class of Odd–Weight–Column SEC–D–ED–SbED Codes for Memory System Applications", IEEE Transactions on Computers, vol. C–33, No. 8, Aug. 1984, pp. 737–739.

Dunning, L., "SEC–BED–DED Codes for Error Control in Byte–Organized Memory Systems", IEEE Transactions on Computers, vol. C–34, No. 6, Jun. 1985, pp. 557–562.

Fujiwara and Pradhan, "Error–Control Coding in Computers," IEEE Transactions on Computers, Jul. 1990.

Chen, "Error–Correcting Codes with Byte–Detection Capability," IEEE Transactions on Computers, vol. C–32, No. 7, Jul. 1983.

Dunning and Varanasi, "Code Constructions for Error Control in Byte Organized Memory Systems," IEEEE Transactions on Computers, vol. C–32, No. 6, Jun. 1983.

(List continued on next page.)

*Primary Examiner*—Stephen M. Baker
*Attorney, Agent, or Firm*—James D. Ivey

[57] ABSTRACT

An S8ED system is implemented in a memory system to detect single errors involving one or more bits in a byte of subject data, stored in and retrieved from the memory system. Relationships between the subject data and parity data, which are used to detect errors in the subject data, are defined by a novel check matrix. The novel check matrix includes a number of constituent matrices, each of which includes eight (8) vectors. Each vector of a constituent matrix (i) has a number of elements which is equal to the number of parity bits used to detect errors in the subject data; (ii) is a concatenation of a building block vector, one or more instances of one of two base generating vectors, and one or more instances of the other of the two base generating vectors; and (iii) is distinct from all other vectors of the same constituent matrix. Each vector of the check matrix represents check data resulting from a single erroneous bit in either the subject data or the initial parity data and accordingly defines relationships between the subject data and the parity data. These relationships are implemented in error correction code generators to derive parity data from subject data to detect errors in the subject data.

85 Claims, 12 Drawing Sheets

OTHER PUBLICATIONS

Kaneda and Fujiwara, "Single Byte Error Correcting-Double Byte Error Detecting Codes for Memory Systems," IEEE Transactions on Computers, vol. C-31, No. 7, Jul. 1982.

Vaidya and Pradhan, "A New Class of Bit- and Byte-Error Control Codes,"IEEE Transactions on Information Theory, vol. 38, No. 5, Sep.1992.

Hsiao, "A Class of Optimal Minimum odd-weight-column SEC-DED Codes," IBM Journal of Research and Development, vol. 14, No. 4, Jul. 1970.

$$H3 = \begin{bmatrix}
0 & 0 & 1 & 1 & 0 & 1 & 0 & 0 & 1 & 0 & 0 & 0 & 0 & 0 & 0 \\
0 & 1 & 0 & 0 & 0 & 0 & 1 & 1 & 0 & 1 & 0 & 0 & 0 & 0 & 0 \\
0 & 0 & 1 & 0 & 1 & 0 & 1 & 0 & 0 & 0 & 1 & 0 & 0 & 0 & 0 \\
1 & 0 & 0 & 1 & 0 & 0 & 1 & 0 & 0 & 0 & 0 & 1 & 0 & 0 & 0 \\
0 & 1 & 0 & 0 & 1 & 0 & 0 & 1 & 0 & 0 & 0 & 0 & 1 & 0 & 0 \\
1 & 0 & 0 & 1 & 0 & 1 & 0 & 1 & 0 & 0 & 0 & 0 & 0 & 1 & 0 \\
1 & 1 & 0 & 1 & 1 & 1 & 0 & 0 & 0 & 0 & 0 & 0 & 0 & 0 & 1 \\
0 & 0 & 1 & 1 & 1 & 0 & 0 & 0 & 1 & 0 & 0 & 0 & 0 & 0 & 0
\end{bmatrix}$$

Fig. 3A $D3 \rightarrow [d_1\ d_2\ d_3\ d_4\ d_5\ d_6\ d_7\ d_8\ p_1\ p_2\ p_3\ p_4\ p_5\ p_6\ p_7\ p_8]$ $H3 \rightarrow \begin{bmatrix} 0 & 0 & 1 & 1 & 0 & 1 & 0 & 0 & 1 & 0 & 0 & 0 & 0 & 0 & 0 & 0 \\ 0 & 1 & 0 & 0 & 0 & 0 & 1 & 1 & 0 & 1 & 0 & 0 & 0 & 0 & 0 & 0 \\ 0 & 0 & 1 & 0 & 1 & 0 & 0 & 1 & 0 & 0 & 1 & 0 & 0 & 0 & 0 & 0 \\ 1 & 0 & 0 & 1 & 0 & 1 & 0 & 0 & 0 & 0 & 0 & 1 & 0 & 0 & 0 & 0 \\ 0 & 1 & 0 & 0 & 1 & 0 & 1 & 0 & 0 & 0 & 0 & 0 & 1 & 0 & 0 & 0 \\ 1 & 0 & 0 & 1 & 0 & 1 & 0 & 0 & 0 & 0 & 0 & 0 & 0 & 1 & 0 & 0 \\ 1 & 1 & 0 & 1 & 0 & 0 & 1 & 0 & 0 & 0 & 0 & 0 & 0 & 0 & 1 & 0 \\ 0 & 0 & 1 & 1 & 1 & 1 & 1 & 0 & 0 & 0 & 0 & 0 & 0 & 0 & 0 & 1 \end{bmatrix}$ $C3 \rightarrow [c_1\ c_2\ c_3\ c_4\ c_5\ c_6\ c_7\ c_8]$ $C3 = H3 \times D3$

Fig. 3B

$$310 \begin{cases} c_1 = d_3 \oplus d_4 \oplus d_6 \oplus p_1 \\ c_2 = d_2 \oplus d_7 \oplus d_8 \oplus p_2 \\ c_3 = d_3 \oplus d_5 \oplus d_8 \oplus p_3 \\ c_4 = d_1 \oplus d_4 \oplus d_7 \oplus p_4 \\ c_5 = d_2 \oplus d_5 \oplus d_8 \oplus p_5 \\ c_6 = d_1 \oplus d_4 \oplus d_6 \oplus p_6 \\ c_7 = d_1 \oplus d_2 \oplus d_4 \oplus d_7 \oplus p_7 \\ c_8 = d_3 \oplus d_4 \oplus d_5 \oplus d_6 \oplus p_8 \end{cases}$$

Fig. 3C

$$320 \begin{cases} p_1 = d_3 \oplus d_4 \oplus d_6 \\ p_2 = d_2 \oplus d_7 \oplus d_8 \\ p_3 = d_3 \oplus d_5 \oplus d_8 \\ p_4 = d_1 \oplus d_4 \oplus d_7 \\ p_5 = d_2 \oplus d_5 \oplus d_8 \\ p_6 = d_1 \oplus d_4 \oplus d_6 \\ p_7 = d_1 \oplus d_2 \oplus d_4 \oplus d_7 \\ p_8 = d_3 \oplus d_4 \oplus d_5 \oplus d_6 \end{cases}$$

Fig. 3D

$bb01 = \begin{bmatrix} 1 & 1 & 0 & 0 \end{bmatrix}$  $bb07 = \begin{bmatrix} 1 & 0 & 0 & 1 \end{bmatrix}$  $bb17 = \begin{bmatrix} 1 & 0 & 1 & 0 \end{bmatrix}$  $bb34 = \begin{bmatrix} 1 & 0 & 0 & 1 \end{bmatrix}$  $bb47 = \begin{bmatrix} 0 & 1 & 1 & 0 \end{bmatrix}$ $bb02 = \begin{bmatrix} 1 & 0 & 1 & 0 \end{bmatrix}$  $bb12 = \begin{bmatrix} 1 & 0 & 0 & 1 \end{bmatrix}$  $bb23 = \begin{bmatrix} 0 & 0 & 1 & 1 \end{bmatrix}$  $bb35 = \begin{bmatrix} 1 & 0 & 1 & 0 \end{bmatrix}$  $bb56 = \begin{bmatrix} 1 & 0 & 0 & 1 \end{bmatrix}$ $bb03 = \begin{bmatrix} 0 & 1 & 1 & 0 \end{bmatrix}$  $bb13 = \begin{bmatrix} 0 & 1 & 0 & 1 \end{bmatrix}$  $bb24 = \begin{bmatrix} 0 & 1 & 0 & 1 \end{bmatrix}$  $bb36 = \begin{bmatrix} 1 & 1 & 0 & 0 \end{bmatrix}$  $bb57 = \begin{bmatrix} 0 & 1 & 0 & 1 \end{bmatrix}$

Fig. 7A

$bb04 = \begin{bmatrix} 0 & 0 & 0 & 0 \end{bmatrix}$ $bb05 = \begin{bmatrix} 0 & 0 & 1 & 1 \end{bmatrix}$ $bb06 = \begin{bmatrix} 0 & 1 & 0 & 1 \end{bmatrix}$ $bb14 = \begin{bmatrix} 0 & 0 & 1 & 1 \end{bmatrix}$ $bb15 = \begin{bmatrix} 0 & 0 & 0 & 0 \end{bmatrix}$ $bb16 = \begin{bmatrix} 0 & 1 & 1 & 0 \end{bmatrix}$ $bb25 = \begin{bmatrix} 0 & 1 & 1 & 0 \end{bmatrix}$ $bb26 = \begin{bmatrix} 0 & 0 & 0 & 0 \end{bmatrix}$ $bb27 = \begin{bmatrix} 1 & 1 & 0 & 0 \end{bmatrix}$ $bb37 = \begin{bmatrix} 0 & 0 & 0 & 0 \end{bmatrix}$ $bb45 = \begin{bmatrix} 1 & 1 & 0 & 0 \end{bmatrix}$ $bb46 = \begin{bmatrix} 1 & 0 & 1 & 0 \end{bmatrix}$ $bb67 = \begin{bmatrix} 0 & 0 & 1 & 1 \end{bmatrix}$

| 7A |
|----|
| 7B |

ERROR DETECTION AND CORRECTION METHOD AND APPARATUS FOR COMPUTER MEMORY

This application is a continuation of application Ser. No. 08/608,530, filed Feb. 28, 1996, now abandoned.

FIELD OF THE INVENTION

The present invention relates to computer memory systems and, in particular, to error detection and correction circuitry used to detect and correct errors in data retrieved from a computer memory.

BACKGROUND OF THE INVENTION

Error detection and correction in data retrieved from a computer memory are used in many computer memory systems available today. For example, single-bit error correction ("SEC") and double-bit error detection ("DED") are well-known and widely used and are described in W. W. Peterson and E. J. Weldon, Jr., *Error-Correcting Codes* (MIT Press 1972). In early computer memory systems, SEC and DED systems were generally considered sufficient since such early computer memory systems used memory devices which have external data paths whose width are each a single bit. The external data path width of a memory device refers to the number of bits which can be stored in and/or retrieved from the memory device and which correspond to a single address of the memory device. Data paths greater than one bit in width, e.g., an eight-bit data path, were accomplished by using separate memory devices in parallel, each memory device representing a single bit of the data path. As a result, the likelihood of multiple bits of a byte of data being erroneous was rather remote in the absence of a systemic design flaw in the memory system since it is highly unlikely that two memory devices are flawed at exactly the same memory cell location.

Currently available computer memory systems use memory devices with wider external data paths, e.g., data paths which are four (4) or eight (8) bits wide. As a result, a defect in a single memory device used in such a computer memory system can result in multiple erroneous bits in a nibble or a byte of data retrieved from a computer memory system using memory devices which have data path widths of four (4) or eight (8) bits, respectively.

While SEC and DED systems are still used, such systems are generally perceived as inadequate since multiple erroneous bits in a particular nibble or byte can be perceived by a SEC system or a DED system as having no erroneous bits. Consider the following as a simple example. Associated with a nibble is a parity bit which is set to ensure that the nibble and parity bit have odd weight, i.e., have an odd number of bits whose value are one. This is generally referred to as odd parity. If the nibble includes two (2) erroneous bits, the weight of the nibble, including the parity bit, remains odd and the error is not detected.

Systems which detect single four-bit errors in a nibble of data, which are generally referred to as S4ED systems, are known and used to detect single-bit, double-bit, triple-bit, and quadruple-bit errors in a nibble of data in computer memory systems using memory devices which have external data paths of four (4) bits in width. For example, one such S4ED system is described in Shigeo Kaneda, "A Class of Odd-Weight-Column SEC-DED-SbED Codes for Memory System Applications," *IEEE Transactions on Computers* Vol. C-33, No. 8 (August 1984). However, in an S4ED system, an error which results in multiple erroneous bits in different nibbles of data retrieved from a memory device whose external data path is eight (8) bits in width may not be detected. For example, a memory device whose external data path is eight bits wide can recall previously stored data which includes erroneous bits in two adjacent nibbles of data and such an error may not be detected by a single S4ED system. Two S4ED systems can be combined to detect errors which include erroneous bits in adjacent nibbles, i.e., to detect the type of error described. However, combination and adaptation of two S4ED systems to detect such errors adds considerable complexity and corresponding cost to a memory system implementing the S4ED systems so adapted.

What therefore remains as an unsolved need is an S8ED (single eight-bit error detection) system and, in particular, an S8ED system which is particularly efficient and requires relatively low cost in terms of circuitry required to implement the S8ED system.

SUMMARY OF THE INVENTION

In accordance with the present invention, an S8ED system is implemented in a memory system to detect single errors involving eight or fewer bits in a byte of one or more bytes of data, i.e., "subject data", stored in and retrieved from the memory system. Relationships between the subject data and parity data, which are used to detect errors in the subject data, are defined by a novel check matrix. Initial parity data, which are derived from the subject data and stored in the memory system when the subject data are stored in the memory system, are subsequently retrieved and compared to check parity data, which are derived from the subject data after the subject data are subsequently retrieved from the memory system.

The check matrix includes a number of vectors which is equal to the sum of the number of bits of the subject data and the number of bits of the parity data. Comparison of the initial parity data to the check parity data produces check data. Each bit of the check data corresponds to and is represented by a respective bit of a vector. If a predetermined vector, e.g., a vector having only elements whose logical value are zero, accurately represents the check data, the subject data contains no errors. Each of the vectors of the check matrix is unique among the vectors of the check matrix and accurately represents check data resulting from a single erroneous bit in either the subject data or the initial parity data. Errors involving a single bit are therefore easily detected and corrected. Errors involving two or more bits within a byte of the subject data result in check data represented by a vector which is neither the predetermined vector nor equal to any of the vectors of the check matrix. Therefore, any error involving eight or fewer bits in a byte of the subject data is detected.

The novel check matrix includes a number of constituent matrices, each of which includes one or more vectors. Each vector of a constituent matrix (i) has a number of elements which is equal to the number of parity bits used to detect errors in the subject data; (ii) is a concatenation of a building block vector, one or more instances of one of two base generating vectors, and one or more instances of the other of the two base generating vectors; and (iii) is distinct from all other vectors of the same constituent matrix.

The building block vector for a particular constituent matrix is derived from a signature vector and the two base generating vectors corresponding to the constituent matrix. For example, one building block vector is the modulo-2 sum of the signature vector and the two base generating vectors.

The signature vector is a vector having a specific value for all constituent matrices of the check matrix. For example, all elements of one signature vector have a logical value of one. The number of elements of the signature vector is one-fourth the number of parity bits used to detect errors in the subject data.

The base generating vectors are vectors which have the same number of elements as the signature vector and have an even weight if the signature vector has an odd weight or have an odd weight if the signature vector has an even weight. Each base generating vector is distinct from all other base generating vectors used to construct a single check matrix. Each unique pair of base generating vectors is used to construct a respective constituent matrix as described above.

The check matrix includes a respective and unique one of the constituent matrices corresponding to each byte of the subject data and an identity matrix which has a number of columns and rows equal to the number of bits of parity data used to detect errors in the subject data. Each vector of the check matrix represents check data resulting from a single erroneous bit in either the subject data or the initial parity data and accordingly defines relationships between the subject data and the parity data. These relationships are implemented in error correction code generators to derive parity data from subject data to detect errors in the subject data and initial parity data.

Prior to storing the subject data in the memory system, an error correction code generator derives the initial parity data from the subject data and stores the initial parity data in conjunction with the subject data. When the subject data are subsequently retrieved from the memory system, a second error correction code generator derives check parity data from the retrieved subject data and compares the check parity data to the initial parity data to produce check data. If the check data are accurately represented by the predetermined vector, the subject data and the initial parity data contain no errors. If the check data are accurately represented by any one of the vectors of the check matrix, a correctable error involving a single bit of either the subject data or the initial parity data is detected. The erroneous bit is identified by the particular position within the check matrix of the vector which accurately represents the check data. If the check data are not accurately represented by the predetermined vector or any of the vectors of the check matrix, an error involving more than one bit of a byte of the subject data and/or the initial parity data is detected.

As a result, errors involving one or more bits of a byte of the subject data or the initial parity data are detected by an S8ED system constructed in accordance with the present invention. The S8ED system can be implemented with substantially minimal circuitry since the check matrix described above has a particularly low weight. Therefore, an S8ED system constructed in accordance with the present invention can be implemented with substantially reduced cost.

BRIEF DESCRIPTION OF THE DRAWINGS

FIG. 3A represents a check matrix in accordance with the present invention. FIG. 3B represents the relationships between the subject data and the parity data as defined by the check matrix of FIG. 3A. FIG. 3C shows boolean logic equations defined by the relationships represented in FIG. 3B. FIG. 3D shows boolean logic equations which are derived from the equations of FIG. 3C and which are used to generate parity data from subject data.

FIG. 7 shows the building block vectors corresponding to an illustrative example of a check matrix constructed in accordance with the present invention.

DETAILED DESCRIPTION

Figure 1:
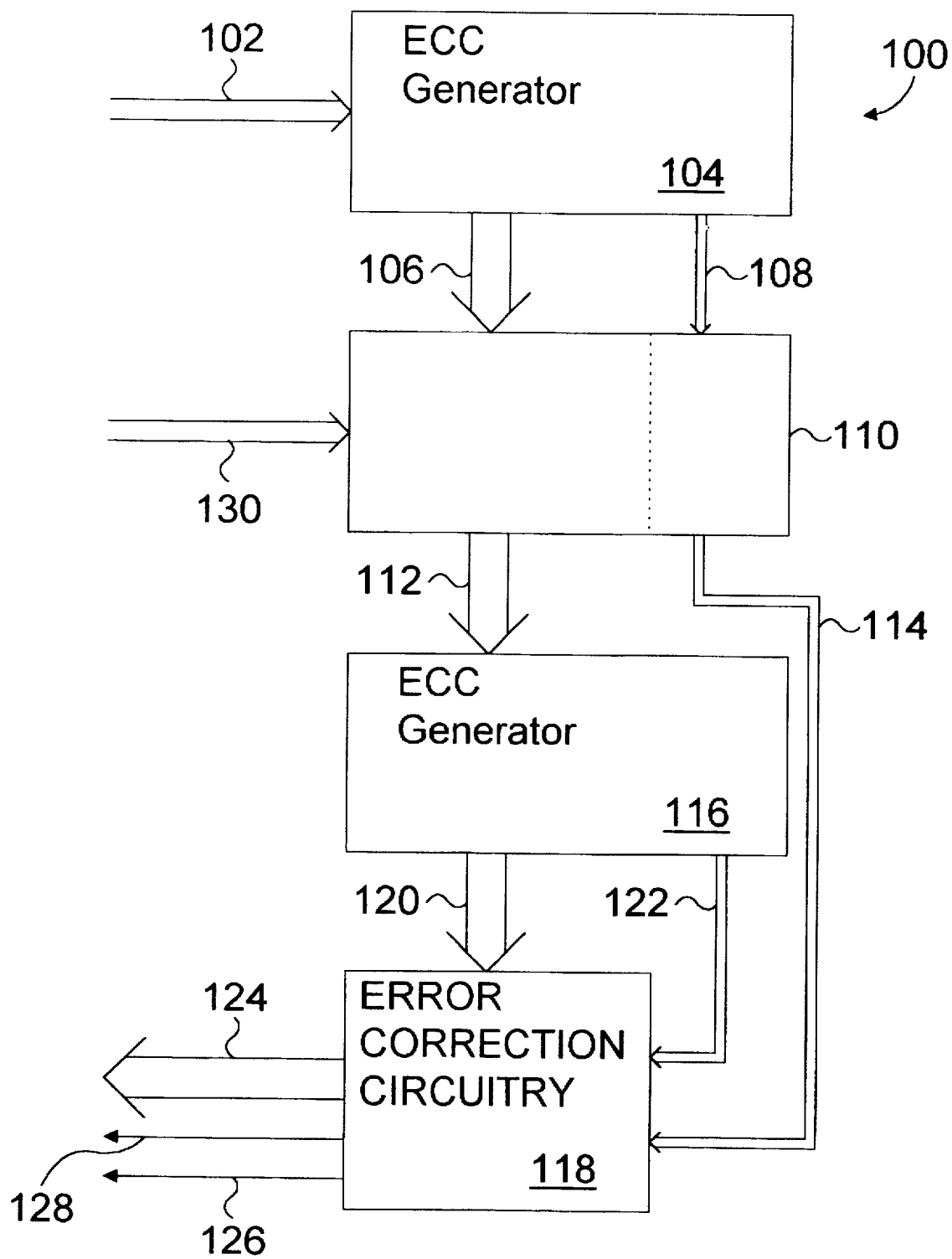
FIG. 1 is a block diagram of a memory system which provides error detection in accordance with the present invention.

In accordance with the present invention, an S8ED system is implemented in a memory system 100 (FIG. 1) to detect single errors involving one or more bits in a byte of data stored in and retrieved from memory system 100. Data are stored in memory system 100 through data input lines 102 which are coupled to an error correction code (ECC) generator 104. In one embodiment, the number of data input lines 102, and therefore the data path width of memory system 100, is 128. ECC generator 104 derives initial parity data from data received through data input lines 102, which is sometimes referred to herein as the "subject data". The derivation of the initial parity data is what subsequently enables detection of single errors involving one or more bits in a byte of the subject data and is described in greater detail below. An error in data refers to a difference between data stored at a particular address within memory system 100 and data subsequently retrieved from memory system 100 at that particular address.

ECC generator 104 supplies to a memory storage 110 the subject data and the initial parity data through buses 106 and 108, respectively, both of which are connected between ECC generator 104 and memory storage 110. Memory storage 110 stores the subject data and the initial parity data at a particular address which is specified by address data received through address lines 130. For example, if memory storage 110 includes memory devices (not shown) whose external data paths are eight (8) bits in width and the subject data includes 128 bits of data and the parity bits include 16 bits of data, sixteen (16) such memory devices store the subject data at the particular address in each such memory device and two (2) such memory devices store the initial parity data at the particular address in each such memory device. The structure of a memory circuit which can store 128 bits of subject data and sixteen (16) bits of initial parity data for each address and which includes eighteen (18) memory devices whose cells store eight (8) bits of data each is conventional and well-known and is not further described herein.

The subject data and parity data are subsequently retrieved from memory storage 110 by specification of the particular address by address data received through address lines 130. The subject data are retrieved from memory storage 110 and transmitted through a bus 112 to another error correction code (ECC) generator 116, and the initial parity data are retrieved from memory storage 110 and transmitted through a bus 114 to error correction and detection circuitry 118. In one embodiment, ECC generator 116 is identical to ECC generator 104 and produces check parity data which ECC generator 116 then asserts on a bus 122 which is connected to error correction and detection circuitry 118. Since ECC generator 116 is identical to ECC generator 104 in this embodiment, the check parity data is identical to the initial parity data retrieved from memory storage 110 if the subject data and retrieved initial parity data contain no errors.

Figure 2:
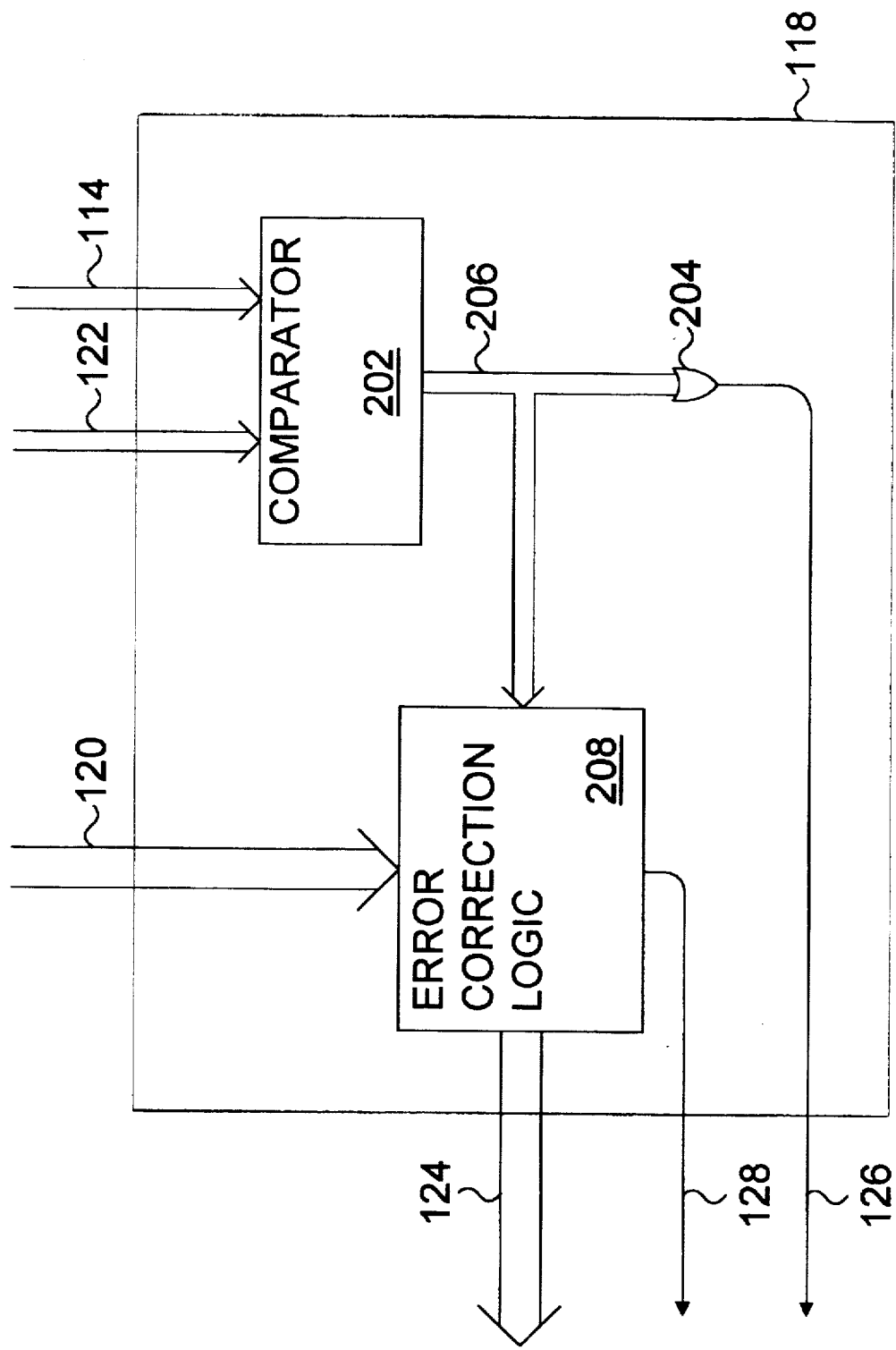
FIG. 2 is a block diagram of error correction circuitry of the memory system of FIG. 1.

Accordingly, error correction and detection circuitry 118 (FIG. 2) includes a comparator 202 which compares the check parity data to the retrieved initial parity data. It is appreciated that comparator 202 can be included in ECC generator 116 and that production of check parity data as an intermediate step is unnecessary. However, comparator 202 is shown as a separate component of memory system 100 for the purposes of illustration. In one embodiment, comparator 202 produces check data which is the result of performing a logical exclusive-OR (XOR) operation on corresponding bits of the retrieved initial parity data and the check parity data. As a result, check data which include only bits of data whose logical value are zero indicate that no errors are found in the retrieved subject data, and the subject data are accordingly passed from bus 120 through error correction and detection circuitry 118 to data output lines 124 (FIGS. 1 and 2).

The check data are passed from comparator 202 through a bus 206 to an OR gate 204 which produces on an error status line 126 an error signal having a first logical value, e.g., a logical one (1), if any bit of the check data has a logical value of one (1) or a second logical value, e.g., a logical zero (0), if all bits of the check data have logical values of zero (0). Bus 206 is also connected to error correction logic 208 which (i) determines according to the check data received through bus 206 whether the error is correctable, i.e., whether only a single bit of the subject data or retrieved initial parity data is in error, and (ii) corrects the error in the data received through bus 120 prior to asserting the data on data output lines 124 if the error is correctable. In addition, error correction logic 208 produces on an error correction status line 128 an error corrected signal which has a first logical value, e.g., a logical one (1), if an error has been corrected or has a second logical value, e.g., a logical zero (0), otherwise.

Thus, errors in the subject data or in the retrieved initial parity data stored in memory storage 110 are detected by comparison of initial parity data generated by ECC generator 104 from subject data received through data input lines 102 and stored in memory storage 110 to check parity data generated by ECC generator 116 from subject data subsequently retrieved from memory storage 110. If the initial parity data is equal to the check parity data, the subject data and initial parity data contain no errors. Conversely, if the initial parity data is not equal to the check parity data, an error is detected and an error signal so indicating is produced on error status line 126. In addition, if the detected error is determined by error correction logic 208 (FIG. 2) to be correctable, the error is corrected and an error corrected signal so indicating is produced on error correction status line 128.

Derivation of Parity Data by ECC Generators

As described briefly above, the specific derivation of initial parity data and check parity data by ECC generator 104 and ECC generator 116, respectively, enables detection of single errors involving one or more bits in a byte of the subject data. At the core of the derivation of parity bits from the subject data is a check matrix which is referred to herein as matrix H. Matrix H is a matrix of bits and has a number of rows equal to the number of bits in the initial parity data and has a number of columns equal to the sum of the number of bits in the initial parity data and the number of bits in the subject data.

As described more completely below, each column vector of matrix H corresponds to a particular bit in composite data which includes both the subject data and the initial parity data. An error involving a single bit in the composite data produces check data on bus 206 (FIG. 2) which is accurately represented by a column vector of matrix H which corresponds to the erroneous bit. A column vector accurately represents check data on bus 206 when the column vector has a number of elements equal to the number of bits in the check data and each element of the column vector accurately represents the logical value of a respective one of the bits of the check data. Errors in multiple bits of the composite data produce check data on bus 206 which is accurately represented by the modulo-2 sum of the column vectors of matrix H which correspond to the respective erroneous bits.

Matrix H is constructed of constituent matrices, which have eight column vectors as described more completely below, and has the following properties:

(a) Each column vector of matrix H is odd weight and unique among the column vectors of matrix H. In addition, each individual column vector of matrix H is distinct from every modulo-2 sum of any two, three, four, five, six, seven, and eight column vectors of a constituent matrix of matrix H as described below. Thus, check data which is accurately represented by a column vector of matrix H indicates that the only erroneous bit of the composite data is the bit at the position within the composite data corresponding to the position within matrix H of the column vector. Accordingly, a single-bit error in the composite data is easily detected and corrected.

(b) The modulo-2 sum of any two (2) column vectors of a constituent matrix of matrix H is a non-zero column vector of even weight. Thus, any error involving two (2) bits in a byte of the composite data produces on bus 206 check data having an even, non-zero number of bits with a logical value of one (1). The check data produced by an error involving two (2) bits of the composite data is accordingly represented by a non-zero column vector having an even weight. An error involving two (2) bits is therefore distinguishable from a correctable error involving a single bit since an error involving a single bit produces check data represented by a column vector of odd weight.

(c) The modulo-2 sum of any three (3) column vectors of a constituent matrix of matrix H is a column vector which (i) includes the signature vector, which is a vector used to derive matrix H and which is non-zero and which is described in greater detail below, or (ii) is distinct from all individual column vectors of matrix H. Thus, any error involving three (3) bits in a byte of the composite data produces on bus 206 check data represented by a column vector which includes the signature vector or which is distinct from all individual column vectors of matrix H. An error involving three (3) bits is therefore distinguishable from a correctable error involving a single bit.

(d) The modulo-2 sum of any four (4) column vectors of a constituent matrix of matrix H is a non-zero column vector of even weight. Thus, any error involving four (4) bits in a byte of the composite data produces on bus 206 check data having an even, non-zero number of bits with a logical value of one (1). The check data produced by an error involving four (4) bits of the composite data is accordingly represented by a non-zero column vector having an even weight. An error involving four (4) bits is therefore distinguishable from a correctable error involving a single bit since an error involving a single bit produces check data represented by a column vector of odd weight.

(e) The modulo-2 sum of any five (5) column vectors of a constituent matrix of matrix H is a non-zero column vector which is distinct from all individual column vectors of matrix H. Thus, any error involving five (5) bits in a byte of the composite data produces on bus 206 check data represented by a column vector which is distinct from all individual column vectors of matrix H. An error involving five (5) bits is therefore distinguishable from a correctable error involving a single bit.

(f) The modulo-2 sum of any six (6) column vectors of a constituent matrix of matrix H is a non-zero column vector of even weight. Thus, any error involving six (6) bits in a byte of the composite data produces on bus 206 check data having an even, non-zero number of bits with a logical value of one (1). The check data produced by an error involving six (6) bits of the composite data is accordingly represented by a non-zero column vector having an even weight. An error involving six (6) bits is therefore distinguishable from a correctable error involving a single bit since an error involving a single bit produces check data representing a column vector of odd weight.

(g) The modulo-2 sum of any seven (7) column vectors of a constituent matrix of matrix H is a column vector which includes the signature vector. Thus, any error involving seven (7) bits in a byte of the composite data produces on bus 206 check data representing a column vector which includes the signature vector. An error involving seven (7) bits is distinguishable from a correctable error involving a single bit since no column vector of matrix H includes the signature vector.

(h) The modulo-2 sum of all eight (8) column vectors of a constituent matrix of matrix H is a column vector having a specific pattern which is non-zero and is described in greater detail below. Thus, any error involving all eight (8) bits in a byte of the subject data produces on bus 206 check data represented by the column vector having the specific pattern. An error involving eight (8) bits is distinguishable from a correctable error involving a single bit since the specific pattern is distinct from all individual column vectors of matrix H.

(i) The number of bits of matrix H having logical values of one (1) are substantially minimized and such bits of matrix H are substantially evenly distributed through matrix H. As a result, logic required to implement ECC generators 104 and 116 (FIG. 1) and error correction logic block 208 (FIG. 2) is relatively minimal and optimal.

As described above, matrix H has n rows and m columns where n is the length in bits of the initial parity data and m is the length in bits of the composite data. Matrix H is defined such that a boolean matrix multiplication of matrix H by a column vector, which represents the composite data and which is sometimes referred to as the composite column vector, yields a column vector, which represents the check data produced on bus 206 and which is sometimes referred to as the check column vector. Since the check data on bus 206 are zero when no errors are present, setting the check column vector, and therefore the n boolean equations defined by the boolean matrix multiplication of matrix H by the composite column vector, to zero defines the logical relationship between the subject data and the initial and check parity data. The logical relationship between the subject data and the initial and check parity data in turn defines the structure and logical operation of ECC generators 104 and 116. It should be noted that the relationship between the subject data and the initial parity data is identical to the relationship between the subject data and the check parity data.

The following is an example which illustrates the definition by matrix H of a relationship between subject data and parity data. FIG. 3A shows an illustrative example of a matrix H3, which is derived in a manner described more completely below and in which in, i.e., the length of the composite data, is 32 and in which n, i.e., the length of the parity data, is 16. The length of the subject data is therefore 16 bits since the composite data includes only the subject data and the associated initial parity data. FIG. 3B shows that a check column vector C3 is the result of boolean matrix multiplication of matrix H3 by a composite column vector D3. Check column vector C3 has a single column and n rows and has as elements bits $c_1$, $c_2$, $c_3$, $c_4$, $c_5$, $c_6$, $c_7$, and $c_8$. Composite column vector D3 has a single column and m rows and has as elements bits $d_1$, $d_2$, $d_3$, $d_4$, $d_5$, $d_6$, $d_7$, and $d_8$, which represent the subject data, and bits $p_1$, $p_2$, $p_3$, $p_4$, $p_5$, $p_6$, $p_7$, and $p_8$, which represent the initial parity data.

FIG. 3C shows n equations 310 resulting from the boolean matrix multiplication represented in FIG. 3B. Setting bits $c_1$, $c_2$, $c_3$, $c_4$, $c_5$, $c_6$, $c_7$, and $c_8$ to zero (0) yields equations 320 (FIG. 3D). For example, parity bit $p_1$ is the output signal produced by an exclusive-OR gate to whose input lines data bits $d_3$, $d_4$, and $d_6$ are applied. Additionally, parity bit $p_3$ is the output signal produced by an exclusive-OR gate to whose input lines data bits $d_3$, $d_5$, and $d_8$ are applied. As described above, ECC generators 104 and 116 (FIG. 1) are identical and use equations 320 (FIG. 3D) to derive parity data from the subject data. Alternatively, ECC generator 116 (FIG. 1) uses equations 310 (FIG. 3C) to generate check data directly without deriving check parity data from the subject data as an intermediate step. The relatively low weight of matrix H3 ensures that logic of ECC generators 104 and 116 (FIG. 1) is substantially minimal, and the relatively even distribution of the weight throughout matrix H3 (FIG. 3A) ensures that no one of parity bits $p_1$, $p_2$, $p_3$, $p_4$, $p_5$, $p_6$, $p_7$, or $p_8$ requires substantially more logic within ECC generators 104 and 116 to generate than is required to generate any other of the parity bits.

Construction of Matrix H

Figure 4:
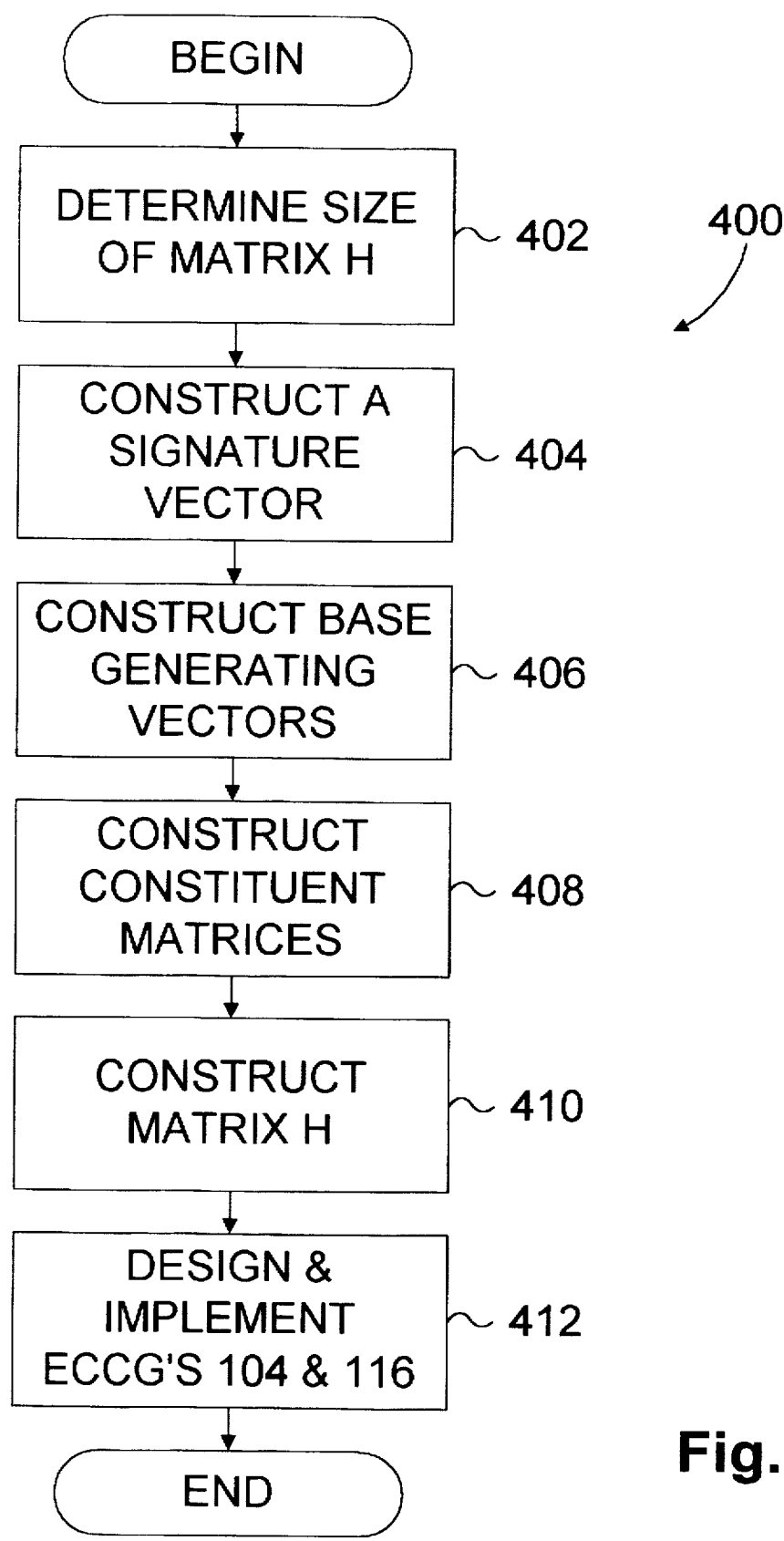
FIG. 4 is a logic flow diagram representing the construction of an error correction code generator in accordance with the present invention.

The properties described above of matrix H, which defines the derivation of initial parity data and check parity data from the subject data by ECC generators 104 and 116, enable the detection of errors involving one or more bits in a byte of the subject data as described above. The construction of matrix H, which is described immediately below, ensures that matrix H has the above-described properties. Logic flow diagram 400 (FIG. 4) illustrates the construction of matrix H and of ECC generators 104 and 116 therefrom. Processing according to logic flow diagram 400 begins in step 402.

In step 402, the dimensions of matrix H are determined. As described above, matrix H has n rows and m columns, where n is the number of bits of initial parity data and m is the length of the composite data, i.e., the number of bits of combined subject and initial parity data. The maximum number of bits of subject data which can be checked for errors in accordance with the present invention using n bits of parity data is given by the following equation (1).

$$n_{databits} = \binom{2^{n/4-1}}{2} \cdot 8 \qquad (1)$$

Processing according to logic flow diagram 400 (FIG. 4) assumes that n, i.e., the number bits of parity data, is an integer multiple of four (4). Assuming for the purposes of illustration that the subject data is 128 bits in length, sixteen (16) bits of parity data are required to check for errors in the subject data in accordance with the present invention. Using equation (1), sixteen (16) bits of parity data can check up to 228 bits of subject data and twelve (12) bits of parity data can check up to 48 bits of subject data. Since the subject data is 128 bits in length and the parity data is sixteen (16) bits in length, matrix H has sixteen (16) rows and 144, i.e., the sum of 128 and sixteen (16), columns.

Processing transfers from step 402 (FIG. 4) to step 404 in which a signature vector is constructed. The signature vector is used both (i) to construct matrix H and (ii) to detect errors involving three (3) or seven (7) bits of a byte in accordance with properties (c) and (g) of matrix H as described above. The signature vector is n/4 bits in length and is unique from all base generating vectors and all building block vectors used to construct matrix H. Base generating vectors and building block vectors are described in greater detail below. In one embodiment, the signature vector is a column vector which has n/4 rows of bits, all of whose logical values are one (1). In this illustrative example, n is sixteen (16) so the signature vector is a column vector of four (4) bits all having a logical value of one (1). A signature vector whose elements are all bits having a logical value of one (1) has been found to result in a matrix H which is particularly low in weight and whose weight is particularly evenly distributed. The weight of the signature vector is odd if the number of bits of the signature vector, and therefore the number of bits whose logical value is one (1), is odd. Conversely, the weight of the signature vector is even if the number of bits of the signature vector, and therefore the number of bits whose logical value is one (1), is even.

Processing transfers from step 404 to step 406 in which a number of base generating vectors are constructed. Specifically, the number of base generating vectors is q which is given by the following equation (2):

$$q = 2^{\frac{n}{4} - 1} \qquad (2)$$

Figure 5:
FIG. 5 shows the base generating vectors corresponding to an illustrative example of a check matrix constructed in accordance with the present invention.

Each of the base generating vectors is equal in dimension to the signature vector, i.e., has one column and n/4 rows. In this illustrative example, each base generating vector has one (1) column and four (4) rows since sixteen (16) divided by four (4) is four (4). The constructed base generating vectors are distinct from one another and each base generating vector has an even weight if the signature vector has an odd weight or has an odd weight if the signature vector has an even weight. In this illustrative example, the signature vector has an even weight. Accordingly, each of the base generating vectors has an odd weight and is unique among the constructed base generating vectors. FIG. 5 shows an illustrative example of the base generating vectors which are constructed in step 404 and which are denoted by bg(j), in which j is an integer between 0 and q−1 inclusive.

Figure 6:
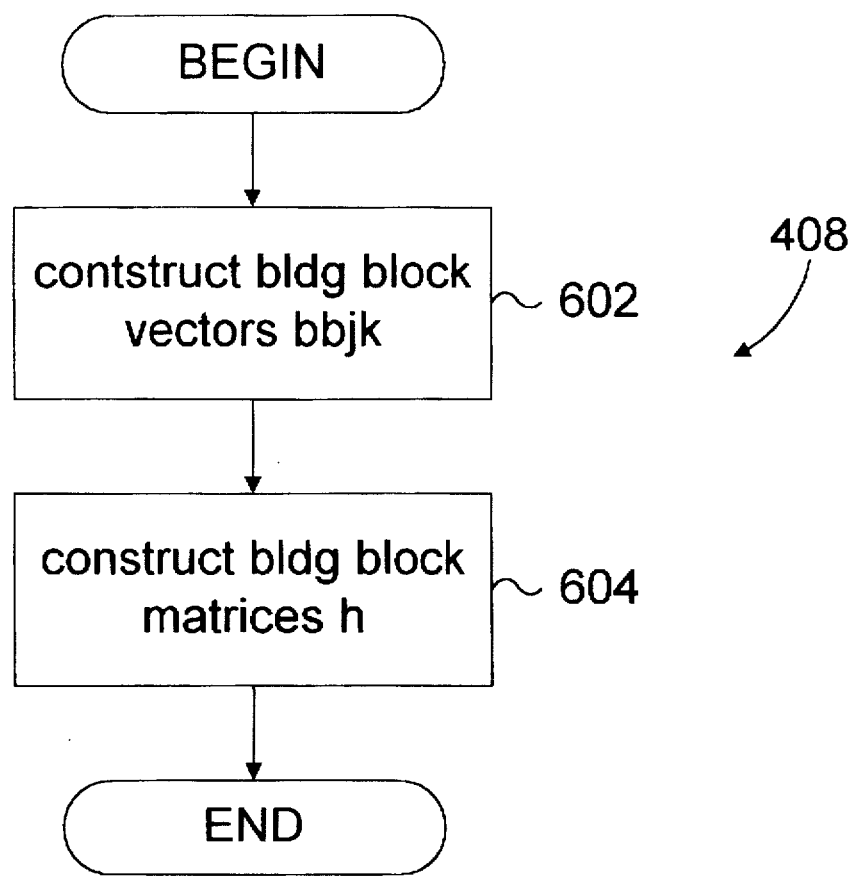
FIG. 6 is a logic flow diagram of the construction of a constituent matrix from a pair of base generating vectors in accordance with the present invention.

Processing transfers from step 406 to step 408 in which a number of constituent matrices are constructed. As described more completely below, some of the constituent matrices are combined to form matrix H. Step 408 is shown more completely as logic flow diagram 408 (FIG. 6) in which processing begins with step 602. In step 602, a number of building block vectors are constructed. Each of the building block vectors has the same dimensions as the signature vector described above and is constructed according to the following equation (3).

$$bbjk = bs + bg(j) + bg(k) \qquad (3)$$

In equation (3), (i) bbjk is a building block vector corresponding to base generating vectors bg(j) and bg(k), (ii) j and k are integers between 0 and q−1 inclusive and are not equal to one another, (iii) bs is the signature vector described above, and (iv) the plus sign ("+") represents a modulo-2 addition operation. A modulo-2 addition operation is functionally equivalent to an exclusive-OR operation. A building block vector is constructed for each possible combination of j and k in equation (3). FIG. 7 shows the building block vectors constructed in accordance with step 602 for the illustrative example of FIG. 5.

Processing transfers from step 602 (FIG. 6) to step 604 in which a constituent matrix h(j,k) is constructed for each building block vector bbjk constructed in step 602. Each constituent matrix h(j,k) is constructed according to the following equation (4).

$$h(j,k) = \begin{bmatrix} bbjk & bg(j) & bg(k) & bg(k) & bbjk & bg(k) & bg(j) & bg(j) \\ bg(j) & bbjk & bg(k) & bg(j) & bg(k) & bbjk & bg(j) & bg(k) \\ bg(j) & bg(k) & bbjk & bg(j) & bg(k) & bg(j) & bbjk & bg(k) \\ bg(k) & bg(k) & bg(j) & bbjk & bg(j) & bg(j) & bg(k) & bbjk \end{bmatrix} \qquad (4)$$

As described above, building block vector bbjk and base generating vectors bg(j) and bg(k) are all column vectors having one column and n/4 rows. Each constituent matrix h(j,k) therefore has eight (8) columns and n rows of bits. In this illustrative example, n is sixteen (16) and n/4 is therefore four (4). Accordingly, each constituent matrix h(j,k) has eight (8) columns and sixteen (16) rows of bits.

As described above, all base generating vectors generated in step 406 (FIG. 4) are distinct from one another. Accordingly, bg(j) is distinct from bg(k). In addition, building block vector bbjk is distinct from bg(j) and bg(k) since bbjk has an odd weight if the signature vector has an odd weight and base generating vectors have an even weight or has an even weight if the signature vector has an even weight and base generating vectors have an odd weight. As a result, the columns of constituent matrix h(j,k) are distinct from one another. In addition, since each base generating vector is distinct from all other base generating vectors constructed in step 406 (FIG. 4) and building block vector bbjk is distinct from all other building block vectors constructed in step 602 (FIG. 6), each of the columns of constituent matrix h(j,k) is distinct from all columns of all other constituent matrices constructed in step 604. Furthermore, all constituent matrices constructed in step 604 have the properties described above for matrix H.

As described above, the modulo-2 sum of all eight (8) column vectors of a constituent matrix of matrix H is a column vector having a specific pattern. The specific pattern of the modulo-2 sum of all eight (8) column vectors of constituent matrix h(j,k) is given by the following equation (5) in which the plus sign ("+") denotes modulo-2 addition:

$$\begin{bmatrix} bg(j) + bg(k) \\ bg(j) + bg(k) \\ bg(j) + bg(k) \\ bg(j) + bg(k) \end{bmatrix} \quad (5)$$

It is appreciated that the columns of constituent matrix h(j,k) have these properties regardless of the particular order of the columns within constituent matrix h(j,k). Accordingly, the columns shown in equation (4) can be reordered without affecting the effectiveness of matrix H constructed from constituent matrix h(j,k) as described below. It is further appreciated that, given that the columns of constituent matrix h(j,k) have the properties described above, fewer than eight column vectors of constituent matrix h(j,k) can be used to detect one or more erroneous bits in a data segment having as many bits. For example, any four column vectors of constituent matrix h(j,k) can be used to detect one or more erroneous bits in a nibble of data to thereby implement an S4ED system.

After step 604, processing according to logic flow diagram 408, and therefore step 408 (FIG. 4) completes. From step 408, processing transfers to step 410 in which matrix H is constructed from the constituent matrices constructed in step 408. Matrix H is constructed from constituent matrices h(j,k) and an identity matrix of dimension n as shown in the following equation (6).

$$H = [h(j1,k1)\ h(j2,k2)\ h(j3,k3) \ldots I] \quad (6)$$

In equation (6), (i) I is an identity matrix with n columns and n rows of bits, (ii) j1, j2, j3, k1, k2, and k3 are integers between 0 and q−1 inclusive, (iii) j1, j2, and j3 do not equal k1, k2, and k3, respectively, and each combination of (j1,k1), (j2,k2), and (j3,k3) is unique from all other such combinations in matrix H.

Figure 8:
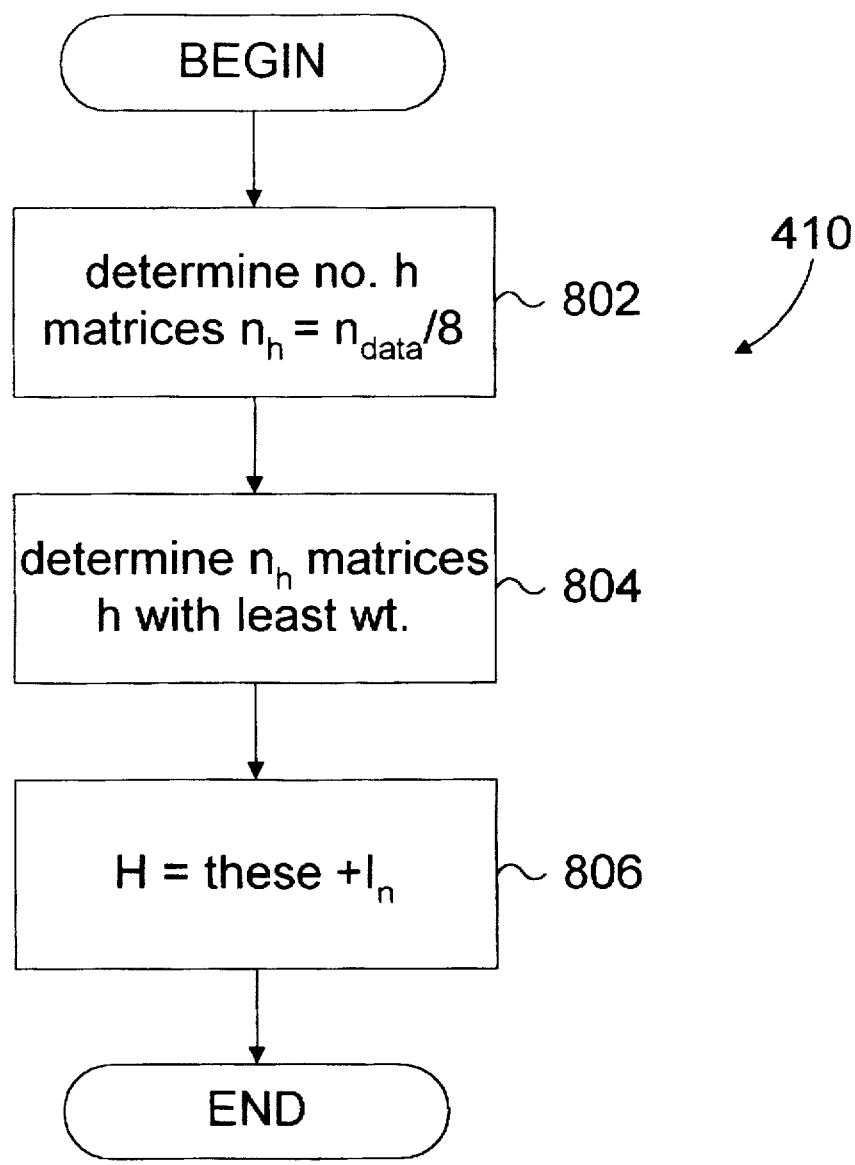
FIG. 8 is a logic flow diagram of the construction of a check matrix from constituent matrices in accordance with the present invention.

Step 410 is shown in greater detail as logic flow diagram 410 (FIG. 8) in which processing begins with step 802. In step 802, the number of constituent matrices h(j,k) which are included in matrix H is determined. Each bit in the subject data corresponds to a column vector of a constituent matrix of matrix H. Since each constituent matrix h(j,k) has eight (8) column vectors in one embodiment, the number of such constituent matrices which are included in matrix H is equal to the number of bits of subject data divided by eight (8). In the illustrative example described above, the number of bits of subject data is 128. Accordingly, sixteen (16) unique constituent matrices h(j,k) are included in matrix H.

Processing transfers from step 802 to step 804 in which the weight of each constituent matrix h(j,k) is determined and the constituent matrices h(j,k) are sorted in order of ascending weight. In this illustrative example, the sixteen (16) constituent matrices h(j,k) having the least weights are selected since sixteen (16) constituent matrices h(j,k) are to be included in matrix H as determined in step 802. As illustrated in the above description corresponding to FIGS. 3A–D, lower weight in matrix H results in reduced complexity in the corresponding circuitry of ECC generators 104 and 116 (FIG. 1). Thus, it is preferred that matrix H is constructed with a relatively minimized weight. However, it is appreciated that matrix H will have the properties described above without performance of step 804 (FIG. 8), albeit with perhaps an increased cost in added circuitry in ECC generators 104 and 116 (FIG. 1).

Processing transfers from step 804 (FIG. 8) to step 806 in which the constituent matrices h(j,k) selected in step 804, or alternatively any sixteen (16) constituent matrices h(j,k), are combined with an identity matrix I having n rows and n columns according to equation (6) above to form matrix H. From step 806, processing according to logic flow diagram 410, and therefore step 410 (FIG. 4), completes. Processing transfers from step 410 to step 412.

As described above with respect to FIGS. 3A–D, matrix H defines the relationships between the subject data and the parity data. In step 412, the relationships between the subject data and the parity data defined by matrix H are implemented in ECC generators 104 (FIG. 1) and 116 such that the parity data is derived from the subject data according to matrix H in the manner described above, e.g., with respect to FIGS. 3A–D.

Single-Bit Error Correction

As described above, error correction logic 208 (FIG. 2) detects and corrects errors in the composite data involving only a single bit. Each of the column vectors of matrix H is equal to check data produced on bus 206 (FIG. 2) in response to an erroneous bit within a composite column vector, e.g., composite column vector D3 (FIG. 3B). The position within matrix H, e.g., matrix H3, of the column vector represented by the check data on bus 206 (FIG. 2) corresponds to the position within the composite column vector, e.g., composite column vector D3 (FIG. 3B), of the erroneous bit. Suppose, for example, that data bit $d_3$ of composite column vector D3 is in error. From equations 310 (FIG. 3C), bits $c_1$, $c_3$ and $c_8$ of the check data on bus 206 (FIG. 2) each have a logical value of one (1), and check bits $c_2$, $c_4$, $c_5$, $c_6$, and $c_7$ each have a logical value of zero (0). These values are represented by the third column vector of matrix H3 (FIG. 3B) and therefore indicate that the third bit in composite column vector D3 is in error. This is appropriate since the third bit in composite column vector D3 is data bit $d_3$, which is the bit in error.

Error correction logic 208 (FIG. 2) compares a column vector which accurately represents check data produced on bus 206, which is sometimes referred to herein as the check column vector, to each individual column of matrix H, e.g., matrix H3 (FIG. 3B). If the check column vector is equal to an individual column vector of matrix H, a correctable error is detected. The correctable error involves only a single erroneous bit of the composite data at a position within the composite data corresponding to the position within matrix H of the individual column vector. In addition, error correction logic 208 (FIG. 2) corrects the erroneous bit of the composite data by logical negation of the erroneous bit when a correctable error is detected. The subject data, after any such correction, is asserted on data output lines 124 by error correction logic 208. Error correction logic 208 also produces on error correction status line 128 an error corrected signal having a first logical value, e.g., one (1), if a correctable error is detected and corrected by error correction logic 208, or a second logical value, e.g., zero (0), if no correctable error is detected by error correction logic 208.

If an error involves more than one bit of the composite data, the check data produced on bus 206 is accurately represented by the modulo-2 sum of the column vectors of matrix H which correspond in position to the erroneous bits in the composite column vector, e.g., composite column vector D3 (FIG. 3B). For example, if data bits $d_2$, $d_3$, and $d_5$ at positions two, three, and five, respectively, within composite column vector D3 are in error; the check data produced on bus 206 (FIG. 2) is accurately represented by the modulo-2 sum of the second, third, and fifth column vectors of matrix H, which is matrix H3 (FIG. 3B) in this example. As described above as a property of matrix H, the modulo-2 sum of any two, three, four, five, six, seven, or eight column vectors of matrix H is non-zero and is distinct from any of the individual column vectors of matrix H. As a result, the error is detected, since the check data are non-zero, and the error is distinguished from a correctable error, since the check data are not represented by any column vector of matrix H.

Use of Memory System 100 in a Computer System

Figure 9:
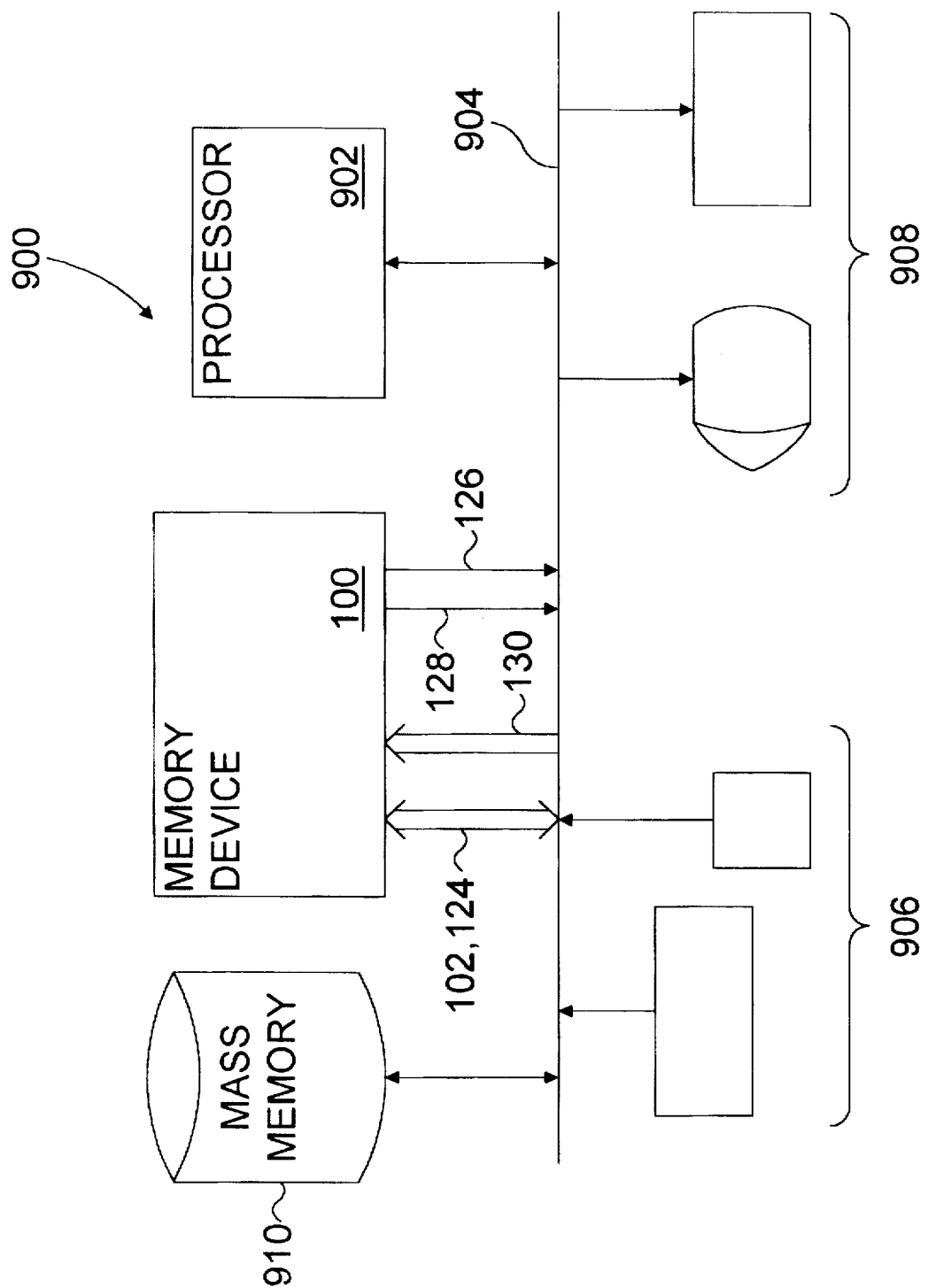
FIG. 9 is a block diagram of a computer system which includes the memory system of FIG. 1 in accordance with the present invention.

Memory system 100 is used in a computer system 900 (FIG. 9) to provide reliable memory access within computer system 900. Most computer systems in use today are of the general architecture shown in FIG. 9. Computer system 900 includes a processor 902 which is coupled through a bus 904 to memory system 100. Processor 902 fetches computer instructions from memory system 100 through bus 904 and executes the fetched computer instructions. Processor 902 also reads data from and writes data to memory system 100 and mass memory 910 which is also coupled to bus 904. Processor 902 can be, for example, the SPARC processor and computer system 900 can be the SPARCstation workstation computer system, both of which are available from Sun Microsystems, Inc. of Mountain View, Calif. Sun, Sun Microsystems, and the Sun Logo are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

Computer system 900 also includes one or more user input devices 906, which can include without limitation a keyboard and an electronic pointing device such as a mouse, trackball, lightpen, digitizing tablet, and/or touch-sensitive pad. A user manipulates user input devices 906 to generate and transmit user-generated command signals through bus 904 to processor 902 which takes appropriate action in response thereto according to computer instructions fetched from memory system 100. In response to computer instructions fetched from memory system 100, and sometimes in response to user generated command signals received from user input devices 906, processor 902 transmits data and control signals to one or more output devices 908 for display to a user. Output devices 908 can include without limitation printers and computer display devices such as cathode-ray tubes (CRTs), light-emitting diode (LED) displays, and liquid crystal displays (LCDs).

When processor 902 writes data, i.e., the subject data, to memory system 100, initial parity data are generated and stored within memory system 100 as described more completely above. Processor 902 specifies a particular location within memory system 100 at which to write the subject data by asserting through bus 904 on address lines 130 address data which specify a particular address within memory system 100. The initial parity data generated and stored within memory system 100 are associated with the same address at which the subject data are stored. Processor 902 then subsequently retrieves the subject data by asserting the same address data on address lines 130 through bus 904 during a read operation. Errors in the subject data or initial parity data are detected, and corrected if only a single bit is in error, in the manner described more completely above. Processor 902 determines that an error in the subject data or initial parity data is detected by receiving through bus 904 an error signal produced by memory system 100 on error status line 126 which is coupled to bus 904. Similarly, processor 902 determines that an error in the subject or parity data is corrected by receiving through bus 904 an error corrected signal produced by memory system 100 on error correction status line 128 which is also coupled to bus 904.

Processor 902 can take appropriate action if an error in subject data retrieved from memory system 100 is detected. For example, if a corrected error is detected in subject data retrieved from memory system 100, processor 902 can cause a warning message to be displayed to a user through output devices 908 that a memory error is detected and corrected. Since the memory error is corrected, processing by processor 902 can continue normally. If an uncorrected error is detected in subject data retrieved from memory system 100, processor 902 can cause an error message to be displayed to the user through output devices 908 and can abort processing. It is appreciated that many other actions can be taken by processor 902 in response to detected errors in retrieved subject data from memory system 100.

In one embodiment, the design of ECC generators 104 and 116 (FIG. 1) as described above, i.e., the derivation of equations 310 (FIG. 3C) and equations 320 (FIG. 3D) according to which ECC generators 104 and 116 (FIG. 1) are designed, is performed by an appropriately programmed computer. In addition, ECC generators 104 and 116 are realized in software which executes within a computer in an embodiment of the present invention.

The above description is illustrative only and is not limiting. The present invention is limited only by the claims which follow.

What is claimed is:

1. A method of constructing error correction code generating circuitry in a memory, the method comprising:
   (A) constructing a signature vector;
   (B) constructing two or more mutually distinct base generating vectors, each of which has an odd weight if the signature vector has even weight or has an even weight if the signature vector has odd weight;
   (C) for one or more combinations of two of the two or more base generating vectors, performing the following steps:
      (i) constructing a building block vector from the signature vector and the two base generating vectors; and
      (ii) constructing a constituent matrix which includes one or more vectors each of which:
         (1) includes a concatenation of one or more instances of the building block vector and one or more instances of at least one of the two base generating vectors; and
         (2) is distinct from all others of the one or more vectors of the constituent matrix;
   (D) combining the one or more constituent matrices with an identity matrix to form a check matrix; and
   (E) assigning a fixed value to a check vector, which is the matrix product of the check matrix and a composite vector which in turn includes subject data bits and associated parity bits, to define relationships between various states of subject data stored in the memory and valid parity data which corresponds to each of the states and which is stored in the memory;

wherein the signature vector is unique with respect to each of the building block vectors and with respect to each of the base generating vectors.

2. The method of claim 1 further comprising the step of:
   configuring circuitry which produces parity data from subject data according to the relationships defined in step (E).

3. The method of claim 1 wherein the signature vector has m element bits; and further wherein each of the two or more base generating vectors has m element bits.

4. The method of claim 3 further comprising the step of: determining a requisite number n of parity bits for detection of errors in subject data stored in the memory.

5. The method of claim 4 wherein each of the one or more vectors of each constituent matrix has n element bits.

6. The method of claim 4 wherein n is an integer multiple of m.

7. The method of claim 4 wherein n is four times m.

8. The method of claim 4 wherein the identity matrix has n rows and n columns.

9. The method of claim 1 wherein each of the vectors of step (C)(ii) is a concatentation of (a) one or more instances of the building block vector, (b) one or more instances of a first of the two base generating vectors, and (c) one or more instances of a second of the two or more base generating vectors.

10. The method of claim 1 wherein each of the element bits of the signature vector has a logical value of one.

11. The method of claim 1 wherein the building block vector is the modulo-2 sum of the signature vector and the two base generating vectors.

12. The method of claim 1 wherein the fixed value is a vector whose element bits all have a logical value of zero.

13. The method of claim 1 wherein one or more vectors of the constituent matrix consist of eight (8) vectors.

14. The method of claim 13 wherein the eight (8) vectors of the constituent matrix include:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

15. The method of claim 1 wherein the one or more vectors of the constituent matrix are selected from the group:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

16. A method for detecting errors in subject data stored in a memory of a computer, the method comprising:

generating from the subject data n bits of parity data according to logical relationships which are between the subject data and the parity data and which are defined by performance of the following steps:

(A) constructing a signature vector;

(B) constructing two or more mutually distinct base generating vectors, each of which has an odd weight if the signature vector has even weight or has an even weight if the signature vector has odd weight;

(C) for one or more combinations of two of the two or more base generating vectors, performing the following steps:

(i) constructing a building block vector from the signature vector and the two base generating vectors; and (ii) constructing a constituent matrix which includes one or more vectors each of which:

(1) includes a concatenation of one or more instances of the building block vector and one or more instances of at least one of the two base generating vectors; and (2) is distinct from all others of the one or more vectors of the constituent matrix;

(D) combining the one or more constituent matrices with an identity matrix to form a check matrix; and (E) assigning a fixed value to a check vector, which is the matrix product of the check matrix and a composite vector which in turn includes subject data bits and associated parity bits, to define relationships between various states of subject data stored in the memory and valid parity data which corresponds to each of the states and which is stored in the memory; wherein the signature vector is unique with respect to each of the building block vectors and with respect to each of the base generating vectors.

17. The method of claim 16 wherein the signature vector has m element bits; and further wherein each of the two or more base generating vectors has m element bits.

18. The method of claim 17 wherein n is an integer multiple of m.

19. The method of claim 17 wherein n is four times m.

20. The method of claim 16 wherein the identity matrix has n rows and n columns.

21. The method of claim 16 wherein the definition of the logical relationships further comprise the step of:

determining n by calculating a requisite number of the parity bits for detection of errors in the subject data.

22. The method of claim 16 wherein each of the one or more vectors of each constituent matrix has n element bits.

23. The method of claim 16 wherein each of the vectors of step (C)(ii) is a concatentation of (a) one or more instances of the building block vector, (b) one or more instances of a first of the two base generating vectors, and (c) one or more instances of a second of the two or more base generating vectors.

24. The method of claim 16 wherein each of the element bits of the signature vector has a logical value of one.

25. The method of claim 16 wherein the building block vector is the modulo-2 sum of the signature vector and the two base generating vectors.

26. The method of claim 16 wherein the fixed value is a vector whose element bits all have a logical value of zero.

27. The method of claim 16 wherein one or more vectors of the constituent matrix consist of eight (8) vectors.

28. The method of claim 27 wherein the eight (8) vectors of the constituent matrix include:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

29. The method of claim 16 wherein the one or more vectors of the constituent matrix are selected from the group:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

30. A memory system comprising error detection circuitry which results from performance of the following steps:

(A) constructing a signature vector;

(B) constructing two or more mutually distinct base generating vectors, each of which has an odd weight if the signature vector has even weight or has an even weight if the signature vector has odd weight;

(C) for one or more combinations of two of the two or more base generating vectors, performing the following steps:

(i) constructing a building block vector from the signature vector and the two base generating vectors; and

19

(ii) constructing a constituent matrix which includes one or more vectors each of which:
   (1) includes a concatenation of one or more instances of the building block vector and one or more instances of at least one of the two base generating vectors; and
   (2) is distinct from all others of the one or more vectors of the constituent matrix;
(D) combining the one or more constituent matrices with an identity matrix to form a check matrix; and
(E) assigning a fixed value to a check vector, which is the matrix product of the check matrix and a composite vector which in turn includes subject data bits and associated parity bits, to define relationships between various states of subject data stored in the memory and valid parity data which corresponds to each of the states and which is stored in the memory;
(F) configuring circuitry which produces parity data from subject data according to the relationships defined in step (E);
wherein the signature vector is unique with respect to each of the building block vectors and with respect to each of the base generating vectors.

31. The memory system of claim 30 wherein the signature vector has m element bits; and
further wherein each of the two or more base generating vectors has m element bits.

32. The memory system of claim 31 wherein the error detection circuitry results from performance of the following step in conjunction with the previously recited steps:
determining a requisite number n of parity bits for detection of errors in subject data stored in the memory.

33. The memory system of claim 32 wherein each of the one or more vectors of each constituent matrix has n element bits.

34. The memory system of claim 32 wherein n is an integer multiple of m.

35. The memory system of claim 32 wherein n is four times m.

36. The memory system of claim 32 wherein the identity matrix has n rows and n columns.

37. The memory system of claim 30 wherein each of the vectors of step (C)(ii) is a concatentation of (a) one or more instances of the building block vector, (b) one or more instances of a first of the two base generating vectors, and (c) one or more instances of a second of the two or more base generating vectors.

38. The memory system of claim 30 wherein each of the element bits of the signature vector has a logical value of one.

39. The memory system of claim 30 wherein the building block vector is the modulo-2 sum of the signature vector and the two base generating vectors.

40. The memory system of claim 30 wherein the fixed value is a vector whose element bits all have a logical value of zero.

41. The memory system of claim 30 wherein one or more vectors of the constituent matrix consist of eight (8) vectors.

42. The memory system of claim 41 wherein the eight (8) vectors of the constituent matrix include:
   (1) a vector which is a concatenation of the following vectors in the following order: the building block vector, the first base generating vector, the first base generating vector, and the second base generating vector;
   (2) a vector which is a concatenation of the following vectors in the following order: the first base generating

20 vector, the building block vector, the second base generating vector, and the second base generating vector;
   (3) a vector which is a concatenation of the following vectors in the following order: the second base generating vector, the second base generating vector, the building block vector, and the first base generating vector;
   (4) a vector which is a concatenation of the following vectors in the following order: the second base generating vector, the first base generating vector, the first base generating vector, and the building block vector;
   (5) a vector which is a concatenation of the following vectors in the following order: the building block vector, the second base generating vector, the second base generating vector, and the first base generating vector;
   (6) a vector which is a concatenation of the following vectors in the following order: the second base generating vector, the building block vector, the first base generating vector, and the first base generating vector;
   (7) a vector which is a concatenation of the following vectors in the following order: the first base generating vector, the first base generating vector, the building block vector, and the second base generating vector; and
   (8) a vector which is a concatenation of the following vectors in the following order: the first base generating vector, the second base generating vector, the second base generating vector, and the building block vector.

43. The memory system of claim 30 wherein the one or more vectors of the constituent matrix are selected from the group:
   (1) a vector which is a concatenation of the following vectors in the following order: the building block vector, the first base generating vector, the first base generating vector, and the second base generating vector;
   (2) a vector which is a concatenation of the following vectors in the following order: the first base generating vector, the building block vector, the second base generating vector, and the second base generating vector;
   (3) a vector which is a concatenation of the following vectors in the following order: the second base generating vector, the second base generating vector, the building block vector, and the first base generating vector;
   (4) a vector which is a concatenation of the following vectors in the following order: the second base generating vector, the first base generating vector, the first base generating vector, and the building block vector;
   (5) a vector which is a concatenation of the following vectors in the following order: the building block vector, the second base generating vector, the second base generating vector, and the first base generating vector;
   (6) a vector which is a concatenation of the following vectors in the following order: the second base generating vector, the building block vector, the first base generating vector, and the first base generating vector;
   (7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

44. Memory error detection circuitry which generates, from subject data stored in a memory of a computer, n bits of parity data according to logical relationships, which are between the subject data and the parity data and which are defined by performance of the following steps:

(A) constructing a signature vector;

(B) constructing two or more mutually distinct base generating vectors, each of which has an odd weight if the signature vector has even weight or has an even weight if the signature vector has odd weight;

(C) for one or more combinations of two of the two or more base generating vectors, performing the following steps:

(i) constructing a building block vector from the signature vector and the two base generating vectors; and (ii) constructing a constituent matrix which includes one or more vectors each of which:

(1) includes a concatenation of one or more instances of the building block vector and one or more instances of at least one of the two base generating vectors; and (2) is distinct from all others of the one or more vectors of the constituent matrix;

(D) combining the one or more constituent matrices with an identity matrix to form a check matrix; and (E) assigning a fixed value to a check vector, which is the matrix product of the check matrix and a composite vector which in turn includes subject data bits and associated parity bits, to define relationships between various states of subject data stored in the memory and valid parity data which corresponds to each of the states and which is stored in the memory;

wherein the signature vector is unique with respect to each of the building block vectors and with respect to each of the base generating vectors.

45. The memory error detection circuitry of claim 44 wherein the signature vector has m element bits; and further wherein each of the two or more base generating vectors has m element bits.

46. The memory error detection circuitry of claim 45 wherein n is an integer multiple of m.

47. The memory error detection circuitry of claim 45 wherein n is four times m.

48. The memory error detection circuitry of claim 44 wherein the identity matrix has n rows and n columns.

49. The memory error detection circuitry of claim 44 wherein the definition of the logical relationships further comprise the step of:

determining n by calculating a requisite number of the parity bits for detection of errors in the subject data.

50. The memory error detection circuitry of claim 44 wherein each of the one or more vectors of each constituent matrix has n element bits.

51. The memory error detection circuitry of claim 44 wherein each of the vectors of step (C)(ii) is a concatentation of (a) one or more instances of the building block vector, (b) one or more instances of a first of the two base generating vectors, and (c) one or more instances of a second of the two or more base generating vectors.

52. The memory error detection circuitry of claim 44 wherein each of the element bits of the signature vector has a logical value of one.

53. The memory error detection circuitry of claim 44 wherein the building block vector is the modulo-2 sum of the signature vector and the two base generating vectors.

54. The memory error detection circuitry of claim 44 wherein the fixed value is a vector whose element bits all have a logical value of zero.

55. The memory error detection circuitry of claim 44 wherein one or more vectors of the constituent matrix consist of eight (8) vectors.

56. The memory error detection circuitry of claim 55 wherein the eight (8) vectors of the constituent matrix include:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

57. The memory error detection circuitry of claim 44 wherein the one or more vectors of the constituent matrix are selected from the group:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

23

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

58. A computer system comprising:

a processor;

a memory system which is operatively coupled to the processor and which stores subject data in response to a write operation performed by the processor and which retrieves subject data in response to a read operation performed by the processor and which includes:

error detection circuitry which derives parity data from the subject data and which results from performance of the following steps:

(A) constructing a signature vector;

(B) constructing two or more mutually distinct base generating vectors, each of which has an odd weight if the signature vector has even weight or has an even weight if the signature vector has odd weight;

(C) for one or more combinations of two of the two or more base generating vectors, performing the following steps:

(i) constructing a building block vector from the signature vector and the two base generating vectors; and (ii) constructing a constituent matrix which includes one or more vectors each of which:

(1) includes a concatenation of one or more instances of the building block vector and one or more instances of at least one of the two base generating vectors; and (2) is distinct from all others of the one or more vectors of the constituent matrix;

(D) combining the one or more constituent matrices with an identity matrix to form a check matrix; and (E) assigning a fixed value to a check vector, which is the matrix product of the check matrix and a composite vector which in turn includes subject data bits and associated parity bits, to define relationships, between various states of subject data stored in the memory and valid parity data which corresponds to each of the states and which is stored in the memory;

(F) configuring circuitry which produces parity data from subject data according to the relationships defined in step (E);

wherein the signature vector is unique with respect to each of the building block vectors and with respect to each of the base generating vectors.

24

59. The computer system of claim 58 wherein the signature vector has m element bits; and further wherein each of the two or more base generating vectors has m element bits.

60. The computer system of claim 59 wherein the error detection circuitry results from performance of the following step in conjunction with the previously recited steps:

determining a requisite number n of parity bits for detection of errors in subject data stored in the memory.

61. The computer system of claim 60 wherein each of the one or more vectors of each constituent matrix has n element bits.

62. The computer system of claim 60 wherein n is an integer multiple of m.

63. The computer system of claim 60 wherein n is four times m.

64. The computer system of claim 60 wherein the identity matrix has n rows and n columns.

65. The computer system of claim 58 wherein each of the vectors of step (C)(ii) is a concatentation of (a) one or more instances of the building block vector, (b) one or more instances of a first of the two base generating vectors, and (c) one or more instances of a second of the two or more base generating vectors.

66. The computer system of claim 58 wherein each of the element bits of the signature vector has a logical value of one.

67. The computer system of claim 58 wherein the building block vector is the modulo-2 sum of the signature vector and the two base generating vectors.

68. The computer system of claim 58 wherein the fixed value is a vector whose element bits all have a logical value of zero.

69. The computer system of claim 58 wherein one or more vectors of the constituent matrix consist of eight (8) vectors.

70. The computer system of claim 69 wherein the eight (8) vectors of the constituent matrix include:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

71. The computer system of claim 58 wherein the one or more vectors of the constituent matrix are selected from the group:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

72. A computer system comprising:

a processor;

a memory system which is operatively coupled to the processor and which stores subject data in response to a write operation performed by the processor and which retrieves subject data in response to a read operation performed by the processor and which includes:

error detection circuitry which generates, from the subject data, n bits of parity data according to logical relationships, which are between the subject data and the parity data and which are defined by performance of the following steps:

(A) constructing a signature vector;

(B) constructing two or more mutually distinct base generating vectors, each of which has an odd weight if the signature vector has even weight or has an even weight if the signature vector has odd weight;

(C) for one or more combinations of two of the two or more base generating vectors, performing the following steps:

(i) constructing a building block vector from the signature vector and the two base generating vectors; and (ii) constructing a constituent matrix which includes one or more vectors each of which:

(1) includes a concatenation of one or more instances of the building block vector and one or more instances of at least one of the two base generating vectors; and (2) is distinct from all others of the one or more vectors of the constituent matrix;

(D) combining the one or more constituent matrices with an identity matrix to form a check matrix; and (E) assigning a fixed value to a check vector, which is the matrix product of the check matrix and a composite vector which in turn includes subject data bits and associated parity bits, to define relationships between various states of subject data stored in the memory and valid parity data which corresponds to each of the states and which is stored in the memory;

wherein the signature vector is unique with respect to each of the building block vectors and with respect to each of the base generating vectors.

73. The computer system of claim 72 wherein the signature vector has m element bits; and further wherein each of the two or more base generating vectors has m element bits.

74. The computer system of claim 73 wherein n is an integer multiple of m.

75. The computer system of claim 73 wherein n is four times m.

76. The computer system of claim 72 wherein the identity matrix has n rows and n columns.

77. The computer system of claim 72 wherein the definition of the logical relationships further comprise the step of:

determining n by calculating a requisite number of the parity bits for detection of errors in the subject data.

78. The computer system of claim 72 wherein each of the one or more vectors of each constituent matrix has n element bits.

79. The computer system of claim 72 wherein each of the vectors of step (C)(ii) is a concatentation of (a) one or more instances of the building block vector, (b) one or more instances of a first of the two base generating vectors, and (c) one or more instances of a second of the two or more base generating vectors.

80. The computer system of claim 72 wherein each of the element bits of the signature vector has a logical value of one.

81. The computer system of claim 72 wherein the building block vector is the modulo-2 sum of the signature vector and the two base generating vectors.

82. The computer system of claim 72 wherein the fixed value is a vector whose element bits all have a logical value of zero.

83. The computer system of claim 72 wherein one or more vectors of the constituent matrix consist of eight (8) vectors.

84. The computer system of claim 83 wherein the eight (8) vectors of the constituent matrix include:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

85. The computer system of claim 72 wherein the one or more vectors of the constituent matrix are selected from the group:

(1) a vector which is a concatenation of the following vectors in the following order: the building block vector, the first base generating vector, the first base generating vector, and the second base generating vector;

(2) a vector which is a concatenation of the following vectors in the following order: the first base generating vector, the building block vector, the second base generating vector, and the second base generating vector;

(3) a vector which is a concatenation of the following vectors in the following order: the second base generating vector, the second base generating vector, the building block vector, and the first base generating vector;

(4) a vector which is a concatenation of the following vectors in the following order: the second base generating vector, the first base generating vector, the first base generating vector, and the building block vector;

(5) a vector which is a concatenation of the following vectors in the following order: the building block vector, the second base generating vector, the second base generating vector, and the first base generating vector;

(6) a vector which is a concatenation of the following vectors in the following order: the second base generating vector, the building block vector, the first base generating vector, and the first base generating vector;

(7) a vector which is a concatenation of the following vectors in the following order: the first base generating vector, the first base generating vector, the building block vector, and the second base generating vector; and (8) a vector which is a concatenation of the following vectors in the following order: the first base generating vector, the second base generating vector, the second base generating vector, and the building block vector.

* * * * *